US011796562B2

(12) United States Patent
Waite et al.

(10) Patent No.: US 11,796,562 B2
(45) Date of Patent: Oct. 24, 2023

(54) ACOUSTIC INTENSITY SENSOR USING A MEMS TRIAXIAL ACCELEROMETER AND MEMS MICROPHONES

(71) Applicants: Nanotok LLC, Eastsound, WA (US); University of Washington, Seattle, WA (US)

(72) Inventors: James W. Waite, Eastsound, WA (US); David Raymond Dall'Osto, Seattle, WA (US); Peter Hans Dahl, Seattle, WA (US)

(73) Assignee: AIVS Inc., Seattle, WA (US)

( * ) Notice: Subject to any disclaimer, the term of this patent is extended or adjusted under 35 U.S.C. 154(b) by 0 days.

(21) Appl. No.: 17/332,390

(22) Filed: May 27, 2021

(65) Prior Publication Data

US 2022/0099699 A1    Mar. 31, 2022

Related U.S. Application Data

(60) Provisional application No. 63/031,700, filed on May 29, 2020.

(51) Int. Cl.
*G01P 15/18* (2013.01)
*G01H 3/10* (2006.01)
(Continued)

(52) U.S. Cl.
CPC ............. *G01P 15/18* (2013.01); *G01H 3/125* (2013.01); *G01S 3/803* (2013.01); *G01S 5/08* (2013.01);
(Continued)

(58) Field of Classification Search
CPC . G01H 3/125; G01H 5/00; G03H 3/00; G01S 3/801; G01S 3/8027; G01S 3/803;
(Continued)

(56) References Cited

U.S. PATENT DOCUMENTS 5,224,170 A    6/1993  Waite, Jr.
6,370,084 B1*  4/2002  Cray .................... G10K 11/006
                                                        367/176
(Continued)

FOREIGN PATENT DOCUMENTS

CN    105987751 A  * 10/2016
KR   20150134913 A  * 12/2015
WO    2018152003 A1    8/2018

OTHER PUBLICATIONS

Dall'Osto, D., et al, "Airborne vector sensor experiments within an anechoic chamber", J. Acoust. Soc. Am. 144, 1854 (2018).
(Continued)

*Primary Examiner* — Herbert K Roberts
(74) *Attorney, Agent, or Firm* — Michael Dryja

(57) ABSTRACT

An airborne acoustic vector sensor for simultaneously measuring triaxial particle acceleration in three dimensions and pressure includes a triaxial MEMS accelerometer sensitive to an Earth gravitational field. The airborne acoustic vector sensor includes one or multiple MEMS microphones sensitive to sound pressure and overlapping the accelerometer in frequency. The airborne acoustic vector sensor includes a solid body having a density approximating a density of air. The accelerometer is mounted in or upon the solid body. The airborne acoustic vector sensor includes a suspension system supporting the accelerometer and solid body within a framework.

12 Claims, 8 Drawing Sheets

(51) Int. Cl.
*G01S 3/803* (2006.01)
*G01S 5/18* (2006.01)
*H04R 29/00* (2006.01)
*G10K 11/00* (2006.01)
*G01H 3/12* (2006.01)
*G01S 5/08* (2006.01)
*G03H 3/00* (2006.01)

(52) U.S. Cl.
CPC ......... *G10K 11/004* (2013.01); *H04R 29/005* (2013.01); *B81B 2201/0235* (2013.01); *B81B 2201/0257* (2013.01); *G03H 3/00* (2013.01); *H04R 2201/003* (2013.01)

(58) Field of Classification Search
CPC .... G01S 3/8032; G01S 3/8036; G01S 3/8038; G01S 3/808; G01S 3/8083; G01S 3/8086; G01S 5/18; G01S 5/186; G01S 5/20; G01S 5/26; G01S 5/30; G01S 15/06; G01S 15/42; G01S 15/46; G01S 15/588; G01S 2015/465; H04R 29/005
See application file for complete search history.

(56) References Cited

U.S. PATENT DOCUMENTS

| | | | | |
|---|---|---|---|---|
| 6,418,082 | B1* | 7/2002 | Hollis | G01S 3/8036 |
| | | | | 367/118 |
| 9,232,332 | B2 | 1/2016 | Ranieri et al. | |
| 9,688,371 | B1* | 6/2017 | Ruffa | B63G 8/001 |
| 2005/0034519 | A1* | 2/2005 | Deng | G01P 15/0915 |
| | | | | 73/514.34 |
| 2006/0044941 | A1* | 3/2006 | Barger | F41J 5/06 |
| | | | | 367/124 |
| 2013/0275077 | A1* | 10/2013 | Kim | G01S 5/18 |
| | | | | 702/152 |
| 2015/0160047 | A1* | 6/2015 | Savage | G01H 17/00 |
| | | | | 73/649 |
| 2015/0276975 | A1* | 10/2015 | Carroll | G01V 7/02 |
| | | | | 73/382 G |
| 2016/0216363 | A1* | 7/2016 | Martin | G01S 3/801 |
| 2016/0363477 | A1* | 12/2016 | Doller | G01H 3/12 |
| 2019/0056473 | A1* | 2/2019 | Zalalutdinov | G01S 3/8034 |
| 2020/0191900 | A1* | 6/2020 | Zalalutdinov | G01H 9/00 |
| 2020/0334961 | A1* | 10/2020 | Kaindl | G01S 13/886 |
| 2021/0318406 | A1* | 10/2021 | Collins | G01N 29/44 |

OTHER PUBLICATIONS

Dall'Osto, D., and Dahl, P., "Preliminary estimates of acoustic intensity vorticity associated with a turbine blade rate", J. Acoust. Soc. Am. 142, 2701 (2017).

Jacobsen, F., and de Bree, H., "A comparison of two different sound intensity measurement principles", J. Acoust. Soc. Am. 118, 1510 (2005).

Williams, R., et al., "Towards acoustic particle velocity sensors in air using entrained balloons: Measurements and modeling", J. Acoust. Soc. Am. 143, 780 (2018).

Guicking D., and Karcher, K., "Active Impedance Control for One-Dimensional Sound", J. Vib., Acoust., Stress, and Reliab. Jul. 1984, 106(3): 393-396 https://doi.org/10.1115/1.3269207.

Simon, D., "Kalman Filtering with State Constraints: A Survey of Linear and Nonlinear Algorithms", IET Control Theory and Applications, Sep. 2010.

I. Djurek, et al, "Analysis of a quadcopter's acoustic signature in different flight regimes," IEEE Access, vol. 8, pp. 10662-10670, 2020.

\* cited by examiner

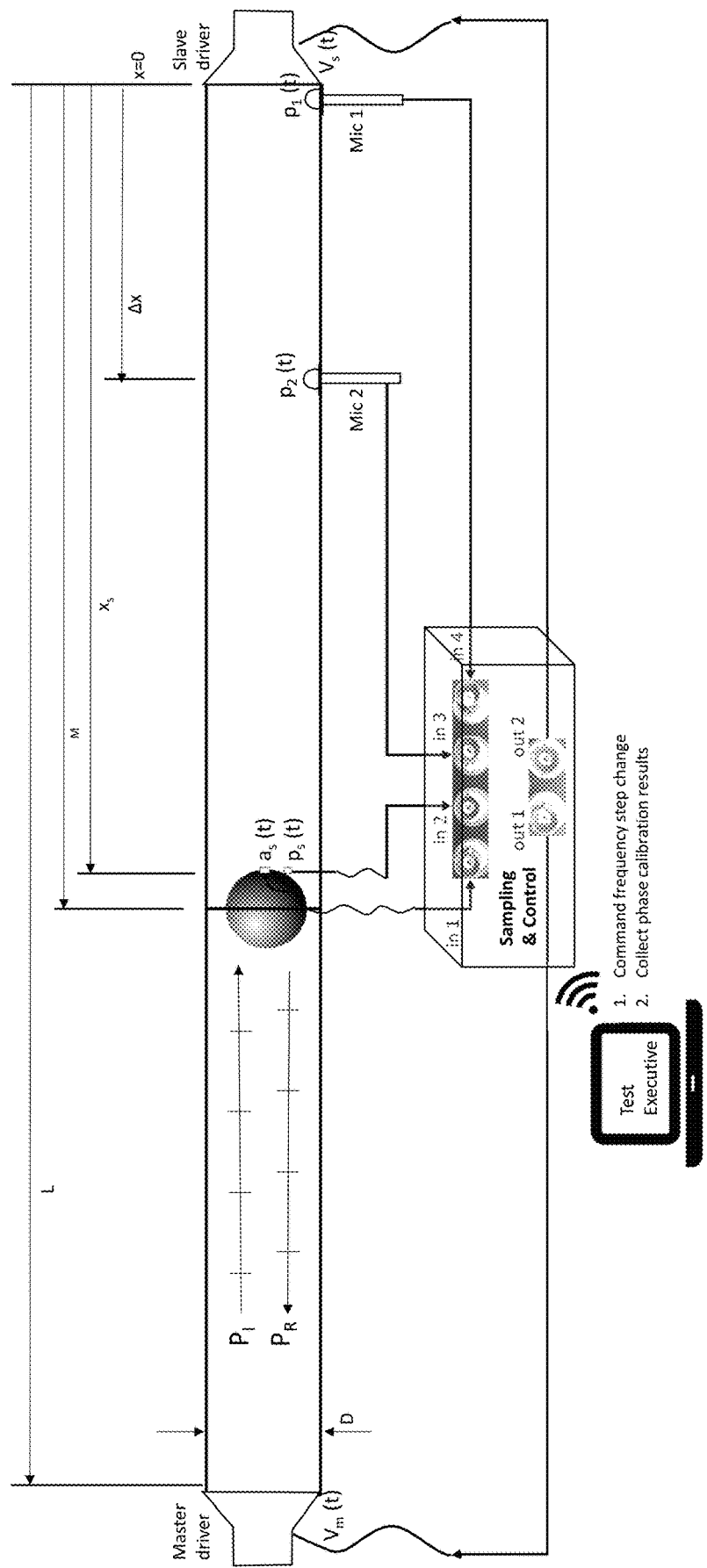
Fig. 7. Acoustic Wave Tube apparatus for calibrating the AIVS

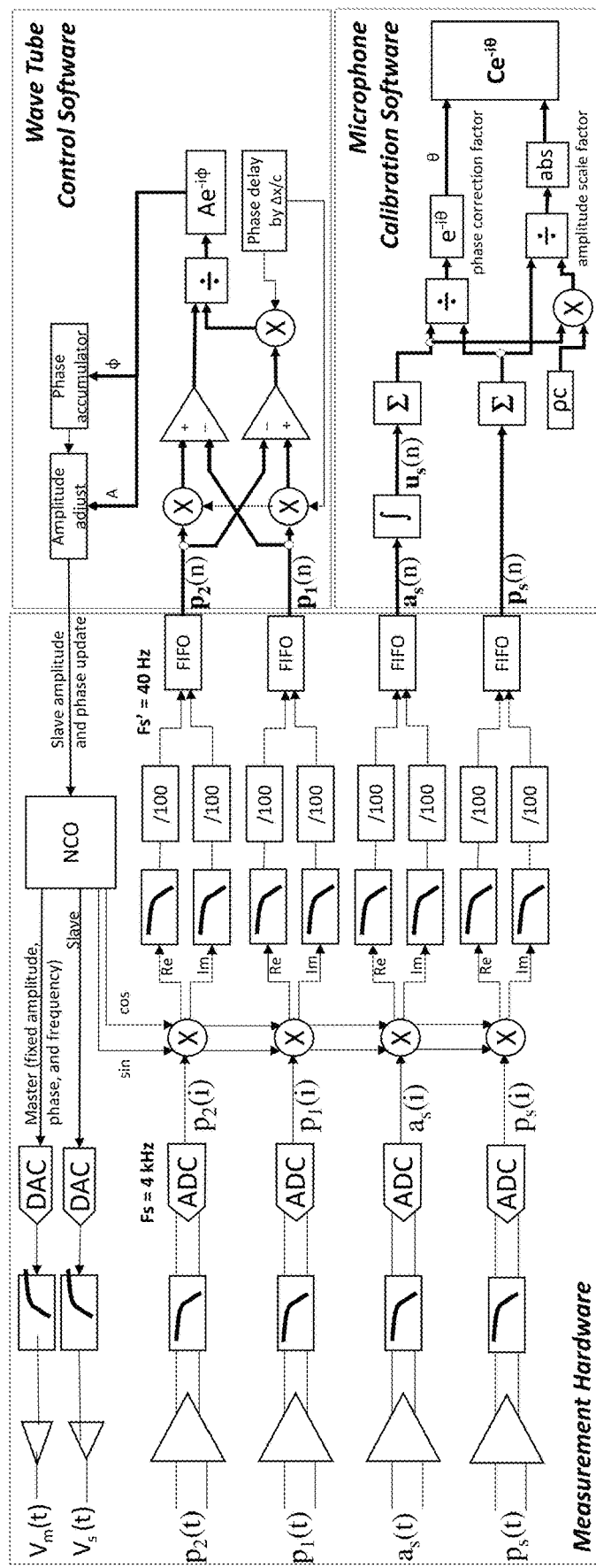
Fig. 8. Acoustic Wave Tube and Microphone Calibration Software

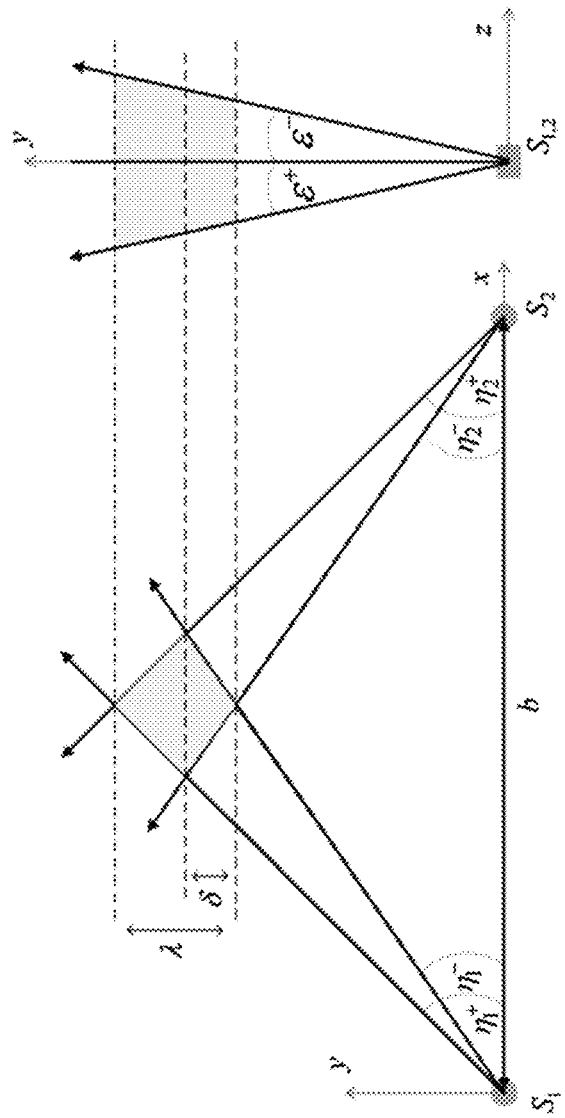
Fig. 10. Range, Elevation, and Azimuth of tracked target with angular error bounds
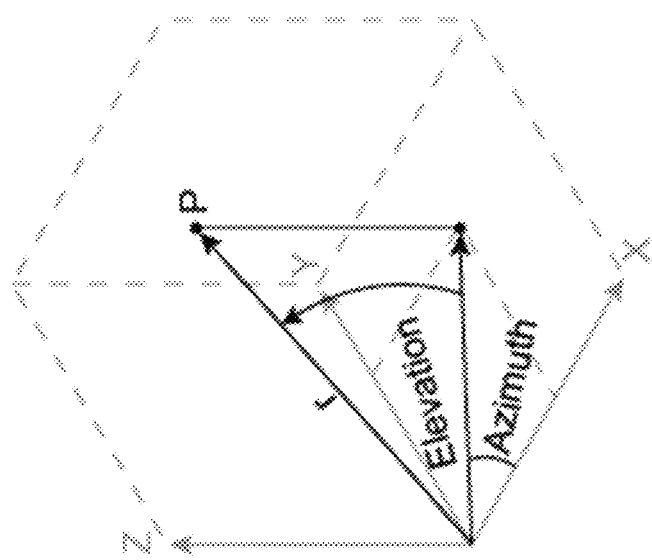
Fig. 9. Elevation and Azimuth from one calibrated AIVS

ACOUSTIC INTENSITY SENSOR USING A MEMS TRIAXIAL ACCELEROMETER AND MEMS MICROPHONES

RELATED APPLICATIONS

This application claims the benefit of the earlier priority date of U.S. Provisional Patent Application No. 63/031,700, entitled "ACOUSTIC INTENSITY SENSOR USING A MEMS TRIAXIAL ACCELEROMETER AND MEMS MICROPHONE filed on May 29, 2020, which is expressly incorporated herein by reference in its entirety.

STATEMENT OF GOVERNMENT INTEREST

This invention was made with government support under Grant no. W911QX-20-P-0032 awarded by the U.S. Army Research Laboratory. The government has certain rights in the invention.

BACKGROUND

Airborne acoustic vector sensors include devices which measure particle velocity or acoustic intensity in one or more dimensions in air. Accurate measurement of airborne particle velocity, combined with simultaneous measurement of acoustic pressure, improves acoustic intensity estimation. Different techniques may be used to estimate or measure acoustic intensity.

BRIEF DESCRIPTION OF THE DRAWINGS

FIG. 7 is a diagram of an example dual-driver acoustic wave tube apparatus used for calibrating an AIVS.

FIG. 8 is a flowchart of an example method for controlling of the loudspeaker drivers of a dual-driver acoustic wave tube, and the related microphone calibration signal processing software to estimate amplitude and phase corrections to the AIVS microphone.

FIG. 9 is a diagram of example computed elevation and azimuth angles of a detected target in the reference frame of AIVS accelerometer.

FIG. 10 is a diagram of an example scenario in which two AIVS collaborate in the detection of a target, with associated error bounds as calculated by a model-based optimization approach.

Figure 1:
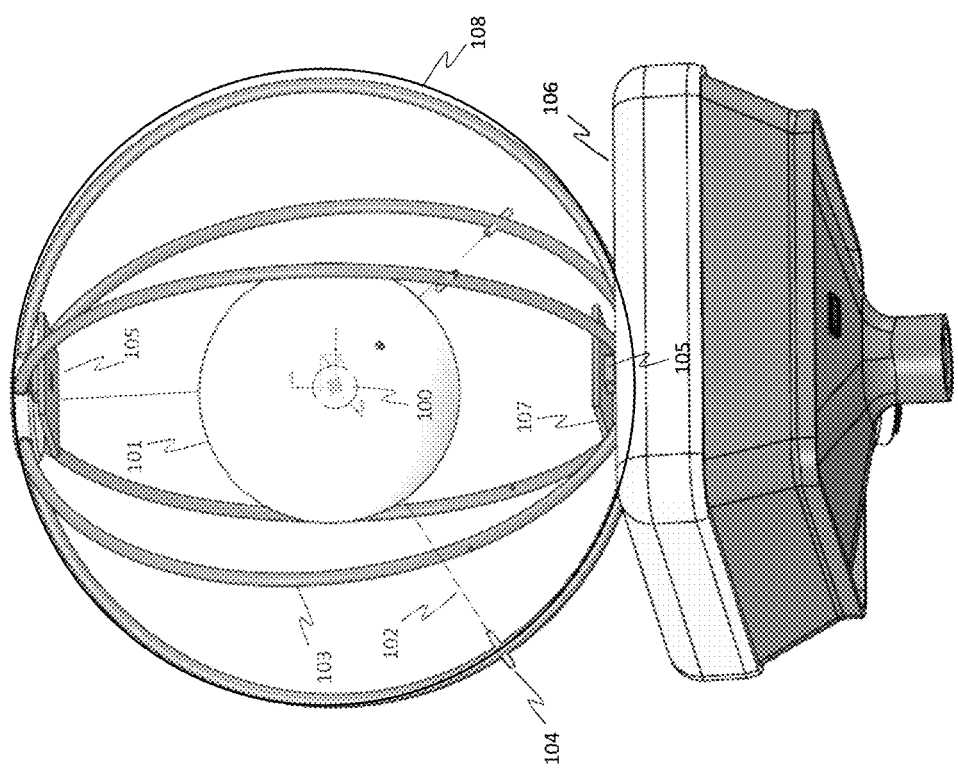
FIG. 1 is an illustration of an example MEMS-based AIVS, including the 3-axis MEMS accelerometer mounted on a lightweight foam body, which is in turn suspended from a framework, with two MEMS microphones present above and below the foam body.

In the figures, like designations in different figures represent the same structures or elements. The representations in each of the figures are diagrammatic and no attempt is made to indicate actual size scales or precise ratios. Proportional relationships are shown as approximates.

DETAILED DESCRIPTION

In the following description, specific details are set forth describing some implementations of the present invention. It will be apparent, however, to one skilled in the art that some implementations may be practiced without some or all of these specific details. The specific implementations disclosed herein are meant to be illustrative but not limiting. One skilled in the art may realize other elements that, although not specifically described here, are within the scope and the spirit of this disclosure.

This description and the accompanying drawings that illustrate inventive aspects and implementations should not be taken as limiting—the claims define the protected invention. Various changes may be made without departing from the spirit and scope of this description and the claims. In some instances, known structures and techniques may not have been shown or described in detail in order not to obscure implementations of the invention.

Elements and their associated aspects that are described in detail with reference to one implementation may, whenever practical, be included in other implementations in which they are not specifically shown or described. For example, if an element is described in detail with reference to one implementation and is not described with reference to a second implementation, the element may nevertheless be claimed as included in the second implementation.

As noted in the background, different techniques may be used to estimate or measure acoustic intensity. A Microflown particle velocity sensor is a MEMS based transducer able to indirectly estimate acoustic particle velocity by differentially measuring the change in resistance of two closely spaced thin wires in a sound field. When sound propagates across the wires, it asymmetrically alters the temperature distribution around the resistors, which is proportional to the acoustic particle velocity. Since sound intensity is equal to the product of particle velocity and pressure, a triaxial intensity probe based on a Microflown sensor includes of three pairs of electrically stimulated wires, along with a microphone to measure acoustic pressure. This is generally referred to as a p-u sound intensity probe, where two different physical measurements are combined to result in acoustic intensity. The Microflown sensor has been rigorously tested. When calibrated, it can accurately measure particle velocity over a wide frequency range, with a caveat that in the near field, phase calibration of the sensor is critical below 200 Hz. This is also true in strongly reactive sound intensity fields, where the pressure and particle velocity are close to 90° out of phase. A velocity phase error as little as 0.1° will result in a sound intensity error of several dB in the very near field.

Also, since the Microflown sensor relies on estimation of a thermodynamic process for particle velocity, sensor calibration must create a correction to a known, reference particle velocity (e.g., within an anechoic chamber) as a function of frequency. Over the sensor's useful bandwidth, this correction is not linear. Below 200 Hz, device sensitivity increases by about 6 dB per octave due to the effect of the thermal boundary layer of the wires. Thus, each Microflown sensor is accompanied by a set of coefficients describing necessary amplitude and phase corrections over the useful bandwidth.

Particle velocity can also be measured by observing the difference in pressure between two closely spaced microphones, which is referred to as the p-p method of calculating sound intensity. The finite difference approximation, in which the particle velocity is approximated by a differential in the pressure between the microphones and the average pressure is measured over the separation distance, leads to systematic measurement errors that can be exacerbated by the type of field under investigation. The microphone separation distance can restrict application of the p-p method to frequencies sufficiently low such that the wavelength exceeds this distance by a factor of five or more. Triaxial p-p probes are configured by mounting three pairs of microphones along each axis with a concentric reference point. Both the p-u and p-p probes arrive at the particle velocity estimate indirectly via estimation via measurement of an indirect physical process (heat advection and pressure differentials, respectively).

A third technique that employs a triaxial accelerometer to measure underwater acoustic particle velocity has been extended to airborne particle velocity. In contrast to the p-u or p-p approaches, the p-a method directly measures the triaxial inertial acceleration of a fixed volume of air. This volume is extended beyond the physical dimension of the accelerometer by placing the device within a very lightweight solid sphere which has density as close to air as possible. For a sphere with cross-section small relative to an acoustic wavelength, the air moves in concert, behaving as a particle. This solid volume can enclose the accelerometer, and so this method can offer improved shielding from environmental effects over both prior art p-u and p-p systems. An accelerometer based acoustic vector sensor can allow for directional resolution of a small fraction of a wavelength, which at low frequencies represents an improvement to finite difference techniques implemented using phase matched p-p intensity probes.

For measurement of acoustic pressure, the triaxial accelerometer can be combined with one or more microphones, and after integrating acceleration to derive particle velocity, acoustic intensity is readily calculated. To distinguish this approach from the others, the acronym AIVS (Accelerometer-based Intensity Vector Sensor) will be used henceforth to refer to these sensors.

The AIVS is sensitive to low frequency noise as the amplitude of acceleration relative to velocity drops by 6 dB/octave toward lower frequencies. Higher frequency responses are limited by the characteristic scale of the solid volume housing the accelerometer (e.g., diameter of the lightweight solid volume), which should be less than about ⅙ of the shortest wavelength to be measured. Between the low frequency noise limit of the sensor and the high frequency limit imposed by sensor size, AIVS probes experience a reduction in sensitivity which is proportional to the ratio of the density of the AIVS (including the solid body within which the accelerometer is mounted, and the accelerometer itself) to the density of air.

The performance of the AIVS, like p-u and p-p intensity probes, is enhanced by a good amplitude and phase calibration of the devices composing the sensor. Unlike probes that map thermodynamic (p-u) or pressure differences (p-p) to velocity, an AIVS velocity calibration relies directly on a physical inertial process, after taking account of the fact that integration of acceleration to compute velocity imparts a 90 degree phase shift. A further benefit results when choosing triaxial MEMS accelerometers as the core velocity sensing component, in that these devices are sensitive down to DC (e.g., can sense the Earth's gravitational field), and thus have very consistent amplitude and phase performance over bandwidths extending up to the rated frequency range of the sensor. MEMS accelerometers are also unique in their ability to self-measure platform tilt, e.g., pitch and roll relative to the gravitational vector.

However, AIVS performance can be biased by the structural support system holding the lightweight solid sphere and enclosed accelerometer. Such AIVS support frameworks are designed to minimize the modal response over the acoustic bandwidth of interest.

Described herein are apparatuses, systems, and methods for an improved acoustic vector sensor, specifically an AIVS. In some examples, an AIVS apparatus measuring triaxial particle velocity in three dimensions, together with pressure, is based on a triaxial MEMS (micro-electro-mechanical system) accelerometer and one or more MEMS microphones, where the accelerometer is sensitive to the Earth's gravitational field, and the microphone bandwidth has some overlap in frequency with the accelerometer, which is mounted within or upon a lightweight solid body with density close to that of air, which in turn is supported by a suspension system within a framework, whereupon a processor applies calibrated amplitude adjustments to each axis of the measured acceleration, and whereupon a processor also applies a frequency dependent amplitude and phase calibration to the measured pressure, using one axis of the accelerometer as a phase reference.

In some examples, a calibration method for an acoustic vector sensor composed of a MEMS triaxial accelerometer mounted within or upon a lightweight solid body and one or more MEMS microphones, including a first calibration of frequency independent scale factors and zero offsets of each axis of a triaxial MEMS accelerometer, with the first calibration being independent of any acoustic stimulation and relying only on the constant Earth's gravitational field, a second calibration of amplitude and phase calibration factors for the MEMS microphone in a free-field acoustic environment, where the amplitude and phase reference for the microphone calibration is a equal to the integrated acceleration of the MEMS accelerometer multiplied by the acoustic impedance of air, and multiplied again by a gain related to the ratio of the combined solid body density and accelerometer to that of air.

The apparatus and methods described herein result in AIVS for measurement of airborne acoustic particle velocity and intensity using light weight accelerometers to reduce the loss in sensitivity proportional to the density ratio between the suspended sensor and air, minimizing structural resonances of the solid volume within or upon which the accelerometer is mounted over the rated bandwidth, without compromising amplitude and phase performances of the triaxial accelerometer and microphone employed within the sensor.

Furthermore, the apparatus and methods described herein, expand the use of such devices to acoustic detection and tracking of unknown sources (for example, for tracking drones in an urban environment), while decreasing the total cost of the sensor so that the sensors can be deployed in volume with sufficient geographic density, such as has occurred in the video surveillance market over the last decade.

Some implementations include the use of a MEMS triaxial accelerometer and one or more MEMS microphones in the construction of an accurate, low cost, three-dimensional AIVS for measurement of acoustic particle velocity and intensity. As depicted in FIG. 1, the accelerometer 100 is mounted within or upon a lightweight solid body 101 with density close to that of air, which in turn is supported by a suspension system within a framework 103 by thin strands 102, which can be monofilament line placed at tetrahedral positions around solid body 101. One or more microphones 105 are placed outside solid body 101, distributed in such a way as to allow measurement of an effective (and unbiased, in terms of magnitude and phase) average sound pressure at the same position as the triaxial MEMS accelerometer. Although accelerometer 100 is depicted as a MEMS component in conventional plastic or ceramic packaging, it will be clear by those skilled in the art that to save weight, the packaging need not be present or could be removed, leaving the silicon device packaged solely by the lightweight solid body.

Figure 2:
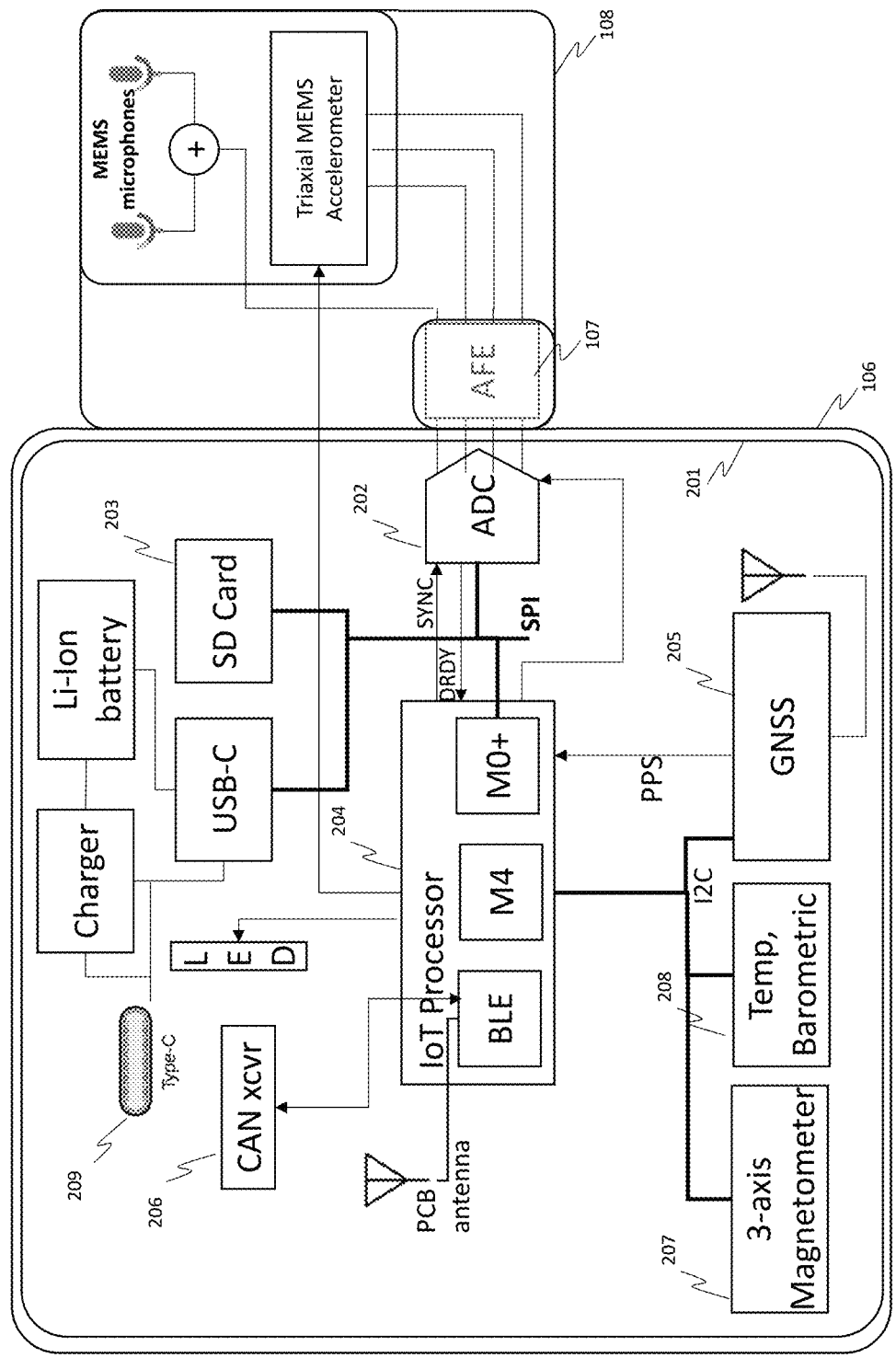
FIG. 2 is a block diagram of an example AIVS node, including an AIVS sensor and an attached processing system which is connected to other AIVS nodes via a wired or wireless network.

Thumbscrews 104 allow tensioning the support system to detune structural responses of the system to unwanted mechanical vibration in the bandwidth of interest, which can affect the response of the accelerometer to acoustic stimulation. MEMS microphones 105 can be bottom-ported, with each mounted on a small printed circuit board (PCB), the bottom of which faces solid body 101. One of these PCBs also serves as the analog front-end (AFE) 107 to processing system 201, pictured in FIG. 2, and housed in enclosure 106. FIG. 1 also shows that the components collectively associated with the analog portion of the AIVS are enclosed by a weatherproof and wind resistant windscreen 108.

Processing system 201 is known as a AIVS node, designed to be low power Internet-of-Things (IoT) system that samples analog AIVS data from AFE 107 by multichannel ADC 202 and performs a variety of functions as will be described hereafter, including acoustic event detection, sound intensity measurement, and bearing angle estimation. IoT processor 204 can be a Cypress PSoC6 System-on-Chip (SoC), which includes two 32-bit processors. One is a fixed-point ARM M0+, which is suitable for front-end filtering, and the other an ARM M4 with hardware floating-point unit (FPU) and is capable of advanced matrix-based Extended Kalman Filter (EKF) operations. GNSS module 205 can provide pulse-per-second (PPS) timing information to node 201 to allow synchronized data acquisition and processing with other such nodes. It can also implement GNSS moving baseline algorithms to provide precision relative baseline information in 3-dimensions between other similarly equipped nodes 201. The processor 204 can be implemented as a system on chip (SoC) and include an embedded wireless capability such as Bluetooth Low Energy (BLE), or Wi-Fi. Similarly, node 201 can provide a wired interface to allow easy connection to other nodes when wiring and local power is available such as when deployed on building roofs. A CAN interface 206 is one common interface that fulfills this goal, but there are others as well as those skilled in the art of embedded development will understand. A 3-axis magnetometer 207 provides an aid to siting enclosure 106 in the local environment, allowing node 201 to estimate its heading with respect to magnetic north in combination with pitch and roll information readily available from 3-axis accelerometer 100. Environmental data sensor 208 provides temperature inputs to the correction algorithms that must account for environmental temperature changes, as well as barometric data to aid in detecting vertical position of enclosure 106 relative to other nodes collaborating on the same network. SD card 203 allows for local recording of ADC data, as well as intermediate results from signal processing steps, which is useful for development and testing purposes. USB interface 209 is used to charge the internal battery and as a software update and debug mechanism for node 201.

Returning to the description of the sensor portion of the AIVS node, an accelerometer is used to measure the motion of a volume of air in which it is placed. Particle velocity is directly computed after integration in the time or frequency domain and scaling. This can be beneficial over approaches that measure particle velocity by indirect methods (differential temperature change across two closely spaced wires, or differential pressure change across two microphones).

Figure 3:
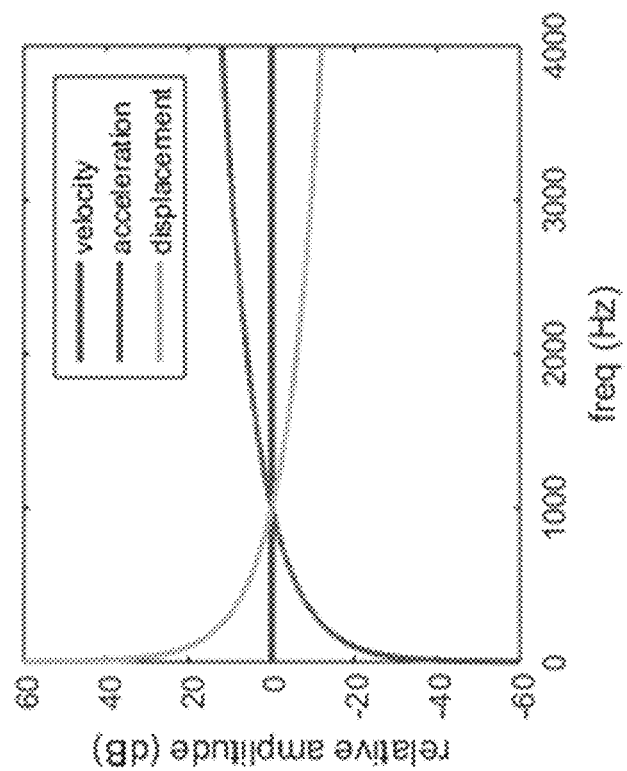
FIG. 3 is a diagram of an example relative response, normalized at 1000 Hz, of three types of inertial sensors when used to estimate particle velocity.

Because acceleration is integrated to compute particle velocity, the sensitivity to velocity drops by 6 dB/octave toward lower frequencies, as demonstrated in FIG. 3. In the figure, 1000 Hz is used as a reference to compare the sensitivity of an intensity probe over frequency, where the inertial sensing modality for particle velocity is displacement, a direct measurement of velocity (e.g. by laser Doppler velocimetry), or acceleration. It should be noted that while there may be reduced sensitivity to velocity at low frequencies when using an accelerometer, there is a corresponding increase in sensitivity at higher frequencies.

Figure 4:
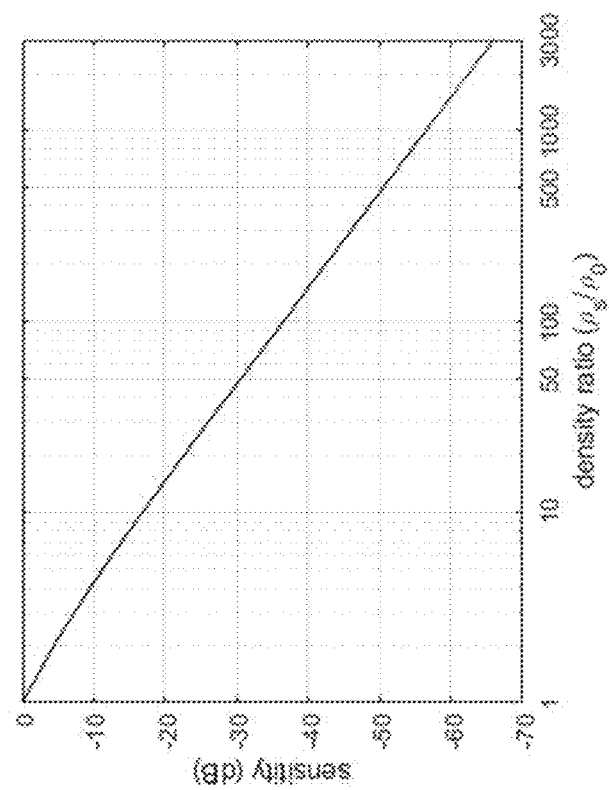
FIG. 4 is a diagram of an example reduction in sensitivity of an AIVS as a function of the density ratio between the triaxial accelerometer, including its surrounding solid volume, and that of air.

One issue that has been overcome is that since the accelerometer has density much greater than air, it should be mounted in a much lighter weight solid body having density as close to air as possible. This amortizes the higher mass of the accelerometer over a larger and lighter volume. Such an AIVS has a sensitivity loss according to:

$$\frac{A_s}{A_0} \sim \frac{3}{1+2\rho_s/\rho_0}, \quad \text{(Eqn. 1)}$$
$$ka \ll 1$$

where $A_s/A_0$ is the acceleration sensitivity loss for the sensor, $\rho_s/\rho_0$ is the ratio of the net density of the combined accelerometer and solid volume to that of air, k is the wavenumber, and a the radius of the spherical volume. FIG. 4 is a graph that shows the sensitivity loss of the AIVS as a function of the density ratio $\rho_s/\rho_0$. A lightweight MEMS triaxial accelerometer (such as the Analog Devices ADXL354 at 0.26 g), mounted within or upon a solid sphere of density close to air, does not significantly bias the overall sensor weight. For example, some types of polystyrene foam are about four times heavier than air, which for a sphere of radius 3 cm yields a weight of 0.54 g. With a small flex PCB to mount the accelerometer and decoupling capacitors, the total weight of the sensor will be 0.9 g, compared to 0.14 g for air in the same volume. Eqn. 1 and FIG. 4 indicates that an AIVS with these parameters will experience a 13 dB loss in sensitivity. Deploying a small 3-d piezoelectric accelerometer (PCB Piezotronics 356A32, which at 4.5 g is twenty times heavier than the MEMS device) in the same volume of polystyrene foam would result in a 28 dB sensitivity loss, which can be partially compensated by increasing the volume of the foam. Although that lowers the highest measurable frequency by the sensor, piezoelectric devices generally have lower noise floors, and hence there may be relevant applications for which a heavier AIVS can be used effectively. At 100 Hz, the piezoelectric device is 3 times more sensitive (10 dB) than the ADXL354 MEMS accelerometer, which directly offsets the aforementioned sensitivity loss.

There are high frequency limits for AIVS based on the cross section of the foam core. Near frequencies where the diameter of the foam sphere is ¼ wavelength, phase deviations from theory occur, due to diffraction effects around the foam housing. To avoid this effect, a smaller foam cross section will increase the practical upper frequency bound of the sensor, but at the same time reduce the effective sensitivity. Lowering the total density of the foam and accelerometer will improve response across all frequencies. By surrounding the accelerometer with a lightweight solid body, it is not necessary to employ conventionally packaged MEMS accelerometers in an AIVS. A manufacturing process that integrates the core silicon die (MEMS device, absent packaging) into an ultra-lightweight stereolithography-printed closed cell lattice structure could reduce the effective volume of an AIVS to a fraction of 1 cm$^3$, which would increase the usable bandwidth of an AIVS sensor to about 10 kHz.

Lighter weight solid materials are presently available. For example, aerogels can be manufactured nearly as light as air, but it is difficult to mount a MEMS accelerometer within or upon a mass of aerogel. 3d printing of graphene-based composites can build complex structures and hold some promise for serving as the lightweight solid volume in AIVS.

As the weight of the solid body enclosing the accelerometer is reduced, it can be increasingly difficult to design a structural support system that does not impact measured accelerations of the corresponding displaced air parcel. Support framework 103 has minimal tension and allows the accelerometer to move freely with the air parcel without higher frequency resonances. If an external mechanical (as opposed to acoustic) impulse is imparted to the structure holding the suspended solid body and MEMS accelerometer, the resulting modal response in any dimension should be small in the useful acoustic frequency bandwidth of the application. Very lightweight foams must move with the air parcel, and not because of a resonance in the structure. Since the triaxial accelerometer embedded within the solid body responds both to vibrations induced mechanically as well as acoustically, mechanical and acoustic stimuli can be segmented during structural support system design stage, and modal responses easily examined. Design changes can be made to ensure that during operation (when it is difficult to distinguish an accelerometer response resulting from an acoustic or mechanical stimulus) modal resonances are outside the bandwidth of interest. In general, lower cost AIVS versions have higher values of the minimum measurable frequency, in part because the structural framework is simpler. Low frequency, infrasound (<20 Hz) AIVS versions have significantly more complex structural support requirements. In some cases, it may be appropriate to actively control damping along each axis using magnetoresistive whiskers based on reference accelerations measured on the structural framework, rather than from within the lightweight solid body.

A MEMS-based AIVS benefits from strong industry trendlines, both in terms of improved MEMS device sensitivity, as well as innovative methods to create ultralightweight solid materials. However, such improvements may not address unavoidable manufacturing variations of a MEMS sensor. For example, the low frequency response of a MEMS microphone is related to the size of the vent hole. To accurately employ a such a device in particle velocity or sound intensity studies, the low frequency response of the microphone may have to be calibrated across a range of frequencies. Likewise, MEMS accelerometer sensitivities are impacted by temperature changes and manufacturing micromachining tolerances. The goal of calibration can be to derive factors within a controlled environment that are used to correct the sensor output in relevant application scenarios. There may be several ways to perform a calibration (e.g., for a microphone, in an anechoic room, outdoor test range, or acoustic wave tube), and end up with the same calibration factors in all cases.

Figure 5:
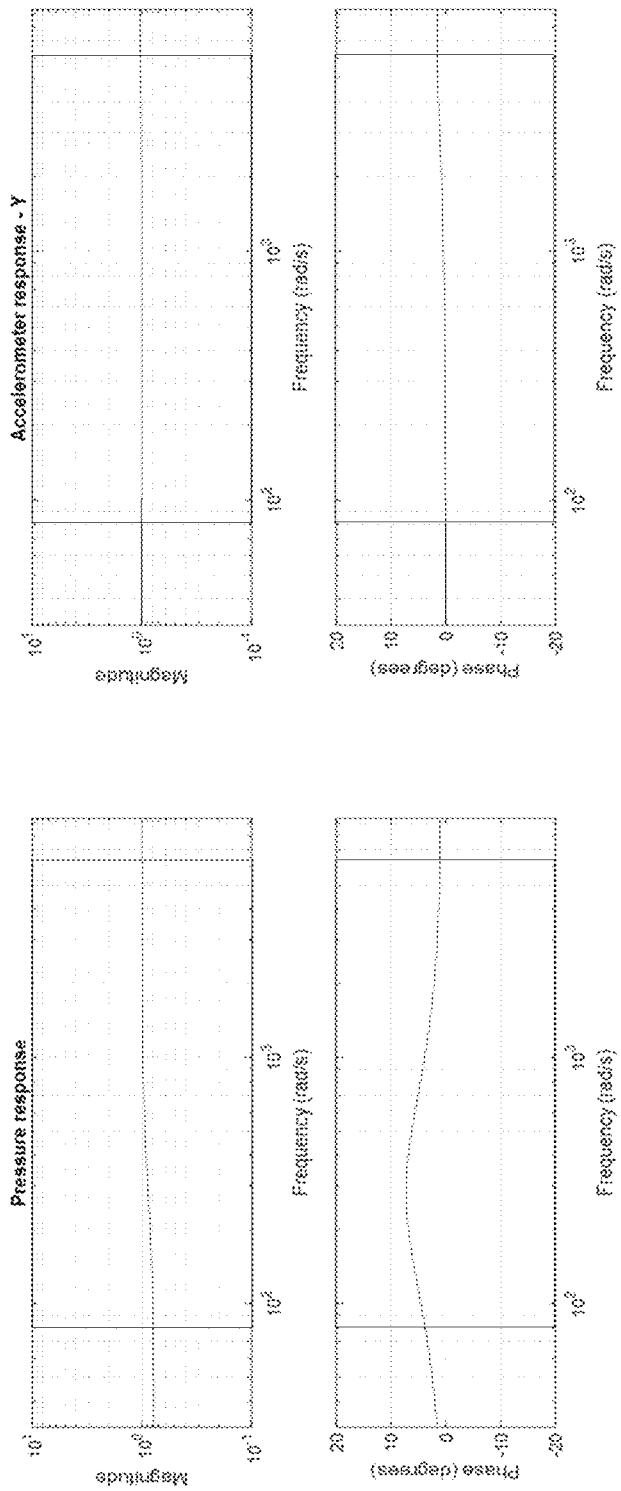
FIG. 5 is a diagram of an example magnitude and phase frequency response of a typical MEMS microphone. The shaded area represents the supported bandwidth of a MEMS AIVS.

Device-to-device phase and amplitude match can provide for accurate measurement of acoustic intensity, particularly at low frequencies below 100 Hz. From a MEMS microphone device datasheet, for example the Invensense ICS-40300 having bandwidth 6 Hz to 10 kHz, can exhibit approximately 2-5 degrees difference from an accelerometer such as the ADXL354 at 100 Hz, and 10-15 degrees at 10 Hz. This can be observed graphically from FIGS. 4 and 5. Thus calibration of such MEMS devices can provide for practical use of MEMS technology in the measurement of sound intensity. Because MEMS microphones are finding use in array processing, beamforming, direction finding, acoustic holography, and other applications which employ good phase match, there are approaches for achieving good calibrations, such as calibration of a set of MEMS microphones against a laboratory reference microphone. U.S. Pat. No. 9,232,332 describes calibration techniques to bring a set of MEMS microphones of the same type into correspondence with each other, even if the nominal behavior of the type is non-ideal. This is acceptable for applications that only need accurate relative magnitude and phase between members of the same type. An AIVS meets this criterion, in that the one (or more) microphones employed must be consistent with each other, as well as the accelerometer across a frequency bandwidth relevant for the acoustic intensity measurement application. Real-time digital correction methods for implementing sensor phase alignment in sound intensity measurement applications, such as those described in U.S. Pat. No. 5,224,170, effectively minimize differences between individual devices that compose a multi-modal sensor. Given the clear advantage of employing phase matched MEMS microphones in a wide variety of applications, device manufacturers have described (e.g., PCT patent application WO 2018/152003) digital feedback control methods to affect analog elements of the MEMS microphone circuitry itself, affecting the loop gain of the circuit. This is intended to adapt each specific manufactured device to a tighter high-pass filter characteristic than otherwise achievable due to manufacturing tolerances, and thereby improve amplitude and phase match between microphones of the same type.

Many MEMS microphones are designed to have a passband that broadly overlaps the audio band and some have good performance at very low frequencies (like the ICS-40300, 6 Hz to 10 kHz). MEMS accelerometers are almost uniformly sensitive down to DC so that the Earth's gravity vector can be measured for important applications like pitch and roll estimation of a static platform. MEMS accelerometers can have flat frequency responses to at least 1 kHz, and some rival the bandwidth of MEMS microphones (e.g., the Analog Devices ADXL1002 accelerometer has a bandwidth to 11 kHz). MEMS accelerometer noise floors also are not frequency dependent in that the output noise density is maintained to near DC, limited only by the 1/f corner of the electronic signal conditioning, which with careful design, can be minimized to 0.01 Hz. The DC response of MEMS accelerometers indicates that there will be little variation in flatness or phase response over a wide frequency range, until the effects of a high frequency resonance outside the upper passband are observed. Certainly, in the low frequency region below 100 Hz, MEMS accelerometers do not exhibit appreciable phase errors.

Low frequency MEMS accelerometer calibration is straightforward, in that single frequency independent scale factor and zero offset are characterized for each of three axes, using the known Earth gravity vector as a calibration stimulus. From the equation of an ellipsoid, it can be seen that $$\left(\frac{a_x + o_x}{s_x}\right)^2 + \left(\frac{a_y + o_y}{s_y}\right)^2 + \left(\frac{a_z + o_z}{s_z}\right)^2 = g^2 \qquad \text{(Eqn. 2)}$$

where s are the scale factors for each axis of the ellipsoid, o are the offsets to the center of the ellipsoid, and a are the triaxial accelerometer measurements. A set of N data samples from each axis are collected as the accelerometer is rotated in space. N must be large enough that the data set describes as completely as possible the 3D space. The calibration uses an optimization solver to find the best 3D ellipsoid that fits the data set and returns the six scale and offset parameters of the ellipsoid. The gravitational field g is nominally 9.81 m/s$^2$, but can be computed more accurately at the calibration location. The equation can be further extended by three more off-diagonal unknowns that represent axis misalignment terms for each pair of axes. Normally, these factors are very small (<1%) for micromachined 3-d accelerometers within a single silicon device, but are not difficult to include in the optimization for a total of 9 unknowns.

Figure 6:
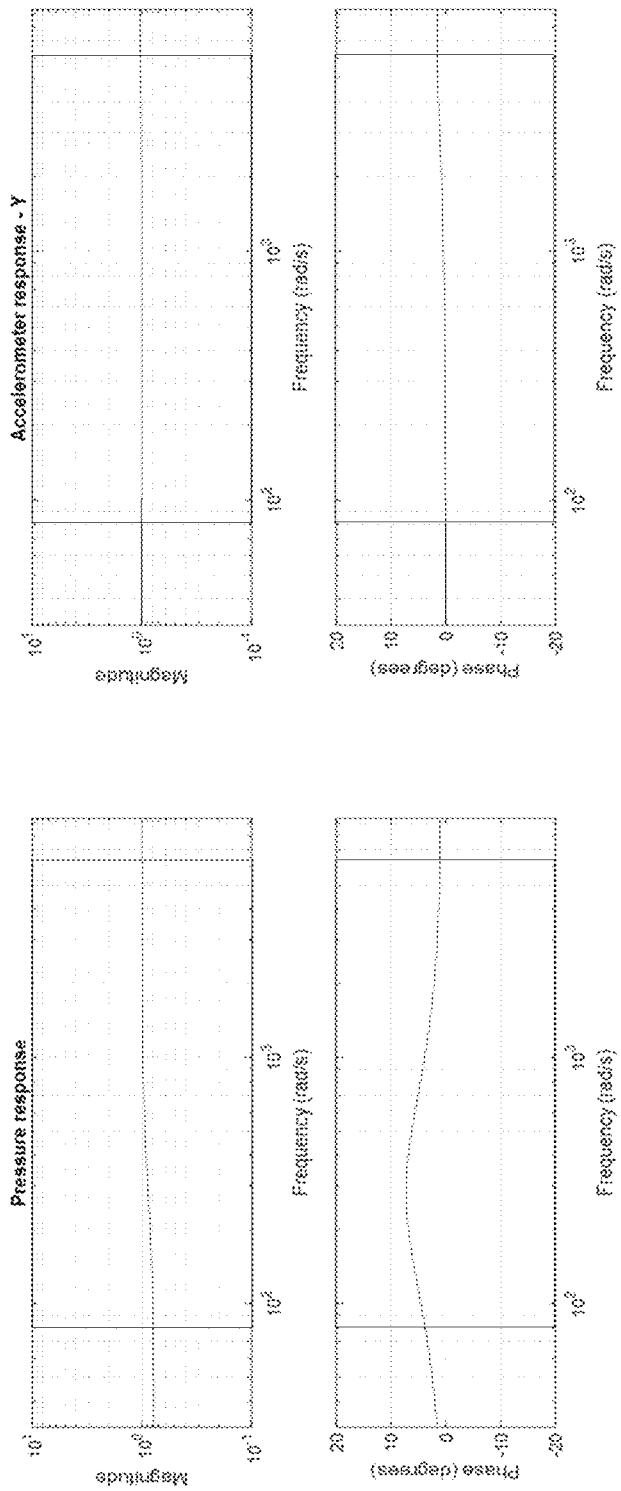
FIG. 6 is a diagram of an example magnitude and phase frequency response of a typical MEMS triaxial accelerometer. The shaded area represents the supported bandwidth of a MEMS AIVS.

The calibrated parameters are taken as valid across the usable bandwidth of the accelerometer. Somewhat more dynamic responses do exist at higher frequencies, as seen in FIG. 6. For example, the ADXL354 has a resonance at 2.5 kHz, but phase errors at higher frequencies and especially above the nominal bandwidth of the device (1.5 kHz) are less consequential on overall performance than those at low frequencies.

Temperature changes are known to affect accelerometer scale factors and offsets, and some MEMS devices (including the ADXL354) output a temperature signal in addition to the three acceleration values. By repeating the accelerometer calibration for at least two temperatures, the computed scale factor and offset values for each axis can be fit to a linear or cubic spline function permitting adjustment over a range bounded by the temperatures experienced during calibration.

Since sound intensity measurements rely on accurate magnitude and phase performance of both the particle velocity and pressure, the MEMS microphone can be calibrated in a way that results in the particle velocity (measured solely from the accelerometer) and pressure (measured by one or more microphones) having the same phase reference. This phase difference can be determined in an anechoic room with one sound source (a loudspeaker) and the AIVS, that is connected to an audio network analyzer. Anechoic rooms are designed to approximate free-field behavior for defined frequency ranges, i.e., there will be minimal reflections of sound emitted from a source, and that in the far field the pressure and particle velocity will be in phase. While the MEMS microphone can be calibrated against an accurate laboratory microphone placed at the same position, the known stability of the MEMS accelerometer, particularly at low frequencies, supports using the accelerometer as a phase reference for the microphone.

This can be performed as follows. In a free field the magnitude of the particle velocity multiplied by the known acoustic impedance is equal to the pressure. So, the pressure $p_s$, referenced to the accelerometer derived particle velocity $u_s$, can be used to compute a set of complex calibration factors at calibration frequencies f using an expression in which time dependence $e^{j\omega t}$ is assumed but omitted:

$$H(f) = \frac{A_s}{A_0} \rho_0 c_0 \frac{u_s}{p_s} \left(1 + \frac{1}{jkr}\right)^{-1} \qquad \text{(Eqn. 3)}$$

In Eqn. 3, $c_0$ is the speed of sound in air at the ambient temperature, k is the wavenumber, and the factor in parentheses refers to the near field effect with r representing the range between the acoustic source and AIVS. In the near field, the pressure and velocity are not perfectly in phase.

$$\frac{A_s}{A_0}$$

is computed from the sensor weight and volume and therefore frequency independent, so H(f) accounts for measured amplitude and phase differences between $p_s$ and the pressure derived from $u_s$. For both the calibration step in which H(f) is measured, and later during correction of field measurements in which H(f) is used to correct the measured pressure $p_s$, the microphone data is prescaled with the nominal scale factor from the manufacturer's datasheet (usually stated in either mV/Pa or dBV).

These calibration values are frequency dependent, unlike the frequency independent values obtained from the accelerometer calibration. A pole-zero representation can be fit to a series of complex scale factors over frequency to allow microphone measurements at any frequency within the calibrated bandwidth to be accurately corrected.

In practice, more than one microphone can be employed in an AIVS, to avoid phase and amplitude bias errors since the microphone is mounted outside the lightweight solid body 101 to avoid additional weight inside body 101, and thus lower AIVS sensitivity. At 1 kHz, a worst-case phase bias of 30° exists in the vertical axis between a MEMS accelerometer mounted within a 3 cm radius solid body, and a single microphone mounted below that spherical volume. To offset that bias, a second microphone can be positioned above the solid body by the same distance. This can be observed from positions of both microphones 105 in FIG. 1. Assuming that the phase of each microphone is matched (either by correction or a selection process), then the average phase at a concentrically positioned internal accelerometer will match that of a single microphone placed at that same concentric position. The aforementioned calibration techniques can then be used to correct the amplitude and phase of the average microphone response to that of the accelerometer. More than two microphones can be distributed in other geometrical arrangements such that the average microphone response compared to the accelerometer is unbiased, e.g., in FIG. 1 microphones could be placed at each of the tetrahedral support framework positions.

A controlled test environment can be used to perform the microphone correction in a free field environment, typically found in an anechoic room. A loudspeaker is driven with a stepped sinusoid over the desired operation bandwidth of the AIVS. The characteristic MEMS microphone high pass filter corner frequency can be from a few Hz (for the Invensense ICS-40300) to a few tens of Hz. The rated bandwidth of the anechoic room free field will be limited by room size and loudspeaker quality, but an AIVS calibration can characterize the low frequency region from about 20 Hz to 500 Hz. At each frequency step, a DFT (Discrete Fourier Transform) can be performed on the microphone channel and the primary excited axis of the accelerometer data, and the correction factors are computed from Eqn. 3. The resulting H(f) values represent the magnitude and phase corrections to be applied to subsequent pressure measurements.

Access to anechoic rooms may be restrictive in both cost and availability. Therefore, a different calibration system can be used to support volume manufacturing of AIVS. FIG. 7 is such an apparatus, including an acoustic wave tube (AWT) of length L, with loudspeaker drivers mounted at both ends of the tube. The tube is composed of two separable sections of length M and L-M. The AIVS is introduced into the tube at the parting location, suspended from lightweight monofilament line with both the triaxial MEMS accelerometer and one or more MEMS microphones at the same distance $x_s$ from the end of the tube.

The tube is driven from both ends with a synchronous sinusoidal signal which may differ in amplitude and phase between the master and slave driver. The master driver frequency, amplitude, and phase are held constant during a calibration measurement at a specific frequency step. This arrangement can setup a known acoustic pressure and velocity field within the tube for each frequency of a defined list of frequencies spanning the AIVS bandwidth. In the known acoustic field, the pressure signal can be calibrated against the already corrected acceleration signal. Of the three accelerometer signals, only the axis aligned with the tube will be active in the one-dimensional sound field.

It is possible to create quasi-free field conditions in the tube by nulling the reflected wave PR via adjustments of the slave loudspeaker amplitude and phase. The system is designed to be stepped in frequency from minimum (dictated by the low end of the loudspeaker frequency response) to maximum (a few hundred Hertz for the AIVS, to cover the range of the dynamics in the pressure microphone response, see FIG. 5). By limiting the loudspeaker output to just a single frequency at a time, small adjustments to the slave loudspeaker amplitude and phase can be made, resulting in effective separation of the incident (Pi) and reflected (PR) waves in the tube via DSP software. The system is shown in FIG. 8.

There are at least four ADC input channels to the sampling system. Two channels are connected to the AIVS (one acceleration signal along the axis of the tube, as well as one or more MEMS microphones). The other two input channels sample laboratory grade pressure microphones $p_1$ and $p_2$. Two DAC output channels drive the loudspeakers on either end of the tube. The hardware on the left side of FIG. 8 preferentially includes signal processing capability, and two DAC output channels. When driven by the same clock as the ADC, the DAC outputs allow phase synchronization between source stimuli and input channel sampling. In sensor calibration applications, both the source outputs and input sampling can be further synchronized to an absolute GNSS timebase. This makes possible phase calibrations in sensor fusion applications, where two or more disparate physical sensors are calibrated in an absolute phase sense.

By demodulating the currently active sinusoidal frequency, a discreet Fourier Transform (DFT, or complex phasor) is computed for all input channels, and subsequently digitally lowpass filtered and decimated to lower the processing bandwidth and timestep of the control loop. In addition to driving the local oscillator complex multiplier, a Numerically Controlled Oscillator (NCO) generates output samples at the current frequency to the loudspeaker signals $V_m(t)$ and $V_s(t)$. In the preferred embodiment, this system will run real-time with the complex phasors $p_1(n)$ and $p_2(n)$ presented by the hardware in a FIFO at a decimated rate of about 100 times less than the ADC sample frequency (or DAC output rate). This sample rate will vary between 2 kHz and 20 kHz, depending on the maximum calibration frequency supported by the AWT.

Subsequent processing steps shown in the Wave Tube Control Software block use the known propagation delay between $x_1$ and $x_2$ ($\Delta x$) to create amplitude A and phase $\varphi$ adjustment factors. Adjustments are applied to the NCO, and hence the slave loudspeaker, such that after convergence a travelling wave (i.e., a free-field condition) is setup in the acoustic wave tube at the current frequency. For this condition, in which the reflection coefficient has been minimized, the acoustic pressure and velocity must be in phase. Since the accelerometer channel is already calibrated and can be treated as a stable phase reference over the designed bandwidth of the acoustic wave tube, any phase deviation between the signals $p_s(n)$ and an integrated $a_s(n)$ is taken as a phase error in the microphone from the accelerometer at that frequency. Note the AWT models a travelling plane acoustic wave by minimizing phase and amplitude differences between pressure $p_s$, and velocity $u_s$ (multiplied by the acoustic impedance $\rho_0 c_0$). Thus, the spherical wave term is one, and the ratio between $p_s$ and $\rho_0 c_0 u_s$ represent component amplitude and phase deviations of the microphone(s) with respect to the accelerometer. Therefore, the AWT-derived correction factors H'(f) are presented in Eqn. 4, where C and $\theta$ are the output of the Microphone Calibration block shown in FIG. 8.

$$H'(f) = \frac{A_s}{A_0} C e^{-i\theta} \qquad \text{(Eqn. 4)}$$

In an example case the magnitude of this factor is expected to deviate from one by about 10-12%, as the flatness of the microphone over its nominal bandwidth is ±1 dB. At frequencies below 100 Hz, the phase correction factor could typically be on the order of 5-10 degrees. These factors are determined over a progression of frequencies and are saved for application in subsequent AIVS measurements.

Temperature can also affect the MEMS microphone output. To calibrate this effect, the interior of the AWT can be a controlled temperature environment. While measuring the temperature at the AIVS, and correcting the accelerometer scale factor and offset for temperature as discussed above, the above-described pressure calibration can be repeated for all frequency steps at two or more temperatures spanning the performance range. Upon calculation of these temperature dependent microphone frequency responses, a linear or cubic spline interpolation is computed at each frequency as a function of temperature, so that appropriate complex scale factor can be determined for use as a correction value at the measured temperature during operation.

A further check on the magnitude of the estimated particle velocity can be done through finite-difference of the two reference microphones $p_1$ and $p_2$. This calculation directly measures the reduction in sensitivity due to density ratio between the AIVS (including foam volume), and air. To perform this test with reference to FIG. 7, the reference microphone locations are moved to new locations in the tube such that the AIVS is positioned midway between the two reference microphones.

Using the same test fixture, the overall sensor calibration (both accelerometer and microphone) can be checked by changing the control parameter from minimizing the reflection coefficient to maximizing the same quantity. This has the effect of setting up standing waves in the tube at known frequencies f. At these specific frequencies, defined as $$f = \frac{nc_0}{2(L+0.8D)},$$ (Eqn. 5)
$$n = 1, 2, 3, \ldots$$

for a tube of length L and diameter D that is open on both ends by virtue of having moving loudspeaker diaphragms, the phase offset between pressure and velocity should be 90°. AIVS calibration results can be rejected if the standing wave frequency check falls outside prescribed bounds.

The described calibration method can be uniquely suited to MEMS devices, focuses on calibration of intrinsic physical properties (complex acceleration and pressure) rather than calibrating measured phase and amplitude deviations from derived quantities (e.g., sound intensity), allows the effects of temperature on the calibration to be incorporated into the method, and is very much compatible with volume manufacturing of a MEMS based AIVS in that the described fixture can be setup anywhere at relatively low cost. In this method, each of the 4-channels in a calibrated AIVS can be considered to share the same phase reference, so that the sensor as a whole provides consistent phase when the individual measurements are combined, for instance in the calculation of sound intensity.

For practical applications, the AIVS may be coupled to a sound intensity processor 204, which may implement application-dependent software related to detection, classification of suspected targets, or source power estimation. In some implementations, one or more AIVS are employed in a source detection and tracking system, where frequency and time dependent acoustic intensity is used for detection, and bearing angles (azimuth and elevation) are needed for tracking.

Drone acoustic signatures are dominated by BPF harmonics in the sub 1 kHz region, with the fundamental in the neighborhood of 120-200 Hz (motor speed 3600 to 6000 RPM). Changes in rotation rates across multiple rotors create pitch and/or roll deviations in the frequency of the harmonics on the order of 20-30%. The degree of pitch or roll contributes to the thrust vector, and hence motion of the drone. These frequency deviations can be used as an indicator as the presence of a drone, compared to typical background urban noise. Rotor RPM variations can be detected on the filter bank outputs shown in FIG. 8. This detection method also suggests that the direction and speed of multicopter drones (forward, reverse, starboard, port) could be classified according to the magnitude of the separation in the rotor frequencies. One distinctive aspect of these signatures is that the BPF harmonics are all strong within 1 kHz bandwidth and occur on every integral harmonic (i.e., a combination of motor noise and blade noise, assuming two blade passes per revolution). A stacked frequency domain detection method can offer separation from signatures of other acoustic events, such as the passing cars and trucks, horns, barking dogs, drilling, sirens, etc. For low power IoT nodes, it is advantageous to run a lower footprint detection method, and only transition to maximum processing upon a positive detection of the desired acoustic source. For the drone detection and tracking application, the post-detection full power mode consists of a Kalman filter, which employs the FPU on processor 204 associated with the ARM M4 core.

In one implementation, this model-based Kalman filter approach is taken in which sound intensity estimation, rather than direct measurement, to improve the robustness of the AIVS, especially for detection and tracking problems. Specifically, for tracking airborne targets a frequency domain state-space filter based on the AIVS is disclosed, composed of the state vector $$x=[s_i, r\ B_i, u_x, \dot{u}_x, u_y, \dot{u}_y, u_z, \dot{u}_z], i=1\ldots n \quad \text{(Eqn. 6)},$$

where $s_i$ is the complex particle velocity expected at the AIVS in frequency band (or bin) i in a radial path from AIVS to acoustic source, r is as defined in Eqn. 3, $B_i$ represents the ratio between pressure and particle velocity and which may vary with frequency, and $u_x$, $u_y$, and $u_z$ are the cartesian unit vectors which describe the azimuth and elevation of the acoustic source as measured in the reference frame of the accelerometer. The rates of change of $u_x$, $u_y$, and $u_z$ are also included in the state vector. The unit vectors are related to the target bearing angles as shown in Eqn. 7 which expresses the cartesian particle velocities in terms of the azimuth φ and elevation θ and the modeled radial velocity (dropping the frequency subscript i for clarity):

$$\begin{bmatrix} s_x \\ s_y \\ s_z \end{bmatrix} = \begin{bmatrix} u_x \\ u_y \\ u_z \end{bmatrix} s = \begin{bmatrix} \cos(\theta)*\cos(\varphi) \\ \cos(\theta)*\sin(\varphi) \\ \sin(\theta) \end{bmatrix} s. \quad \text{(Eqn. 7)}$$

Angles φ and θ are with respect to the reference frame of the accelerometer. Rather than the unit vectors, the bearing angles could be represented in the state vector directly. For implementation reasons, the unit vectors are preferred since they change smoothly without discontinuities as can result from −π to +π azimuth angle tracking. Tracking the three components of the unit vector also facilitate use of state constraints in Kalman filtering. For example, it should be true that the square root of the summed magnitude of the three cartesian components of the unit vector is equal to one. This is known as a perfect measurement, which in one contemplated implementation is added to the measurement vector. Similarly, each individual unit vector component should lie within the range [−1,1]. This is an inequality constraint and can be similarly incorporated into the Kalman filter.

Depending on the tracking application, the state vector x may include particle velocity values in one to several frequency bins i, of fixed or variable bandwidth, depending on application. For example, a narrowband target may include only a single radial particle velocity vector at one frequency. Targets better characterized in multiple octave or one-third octave bands can be defined by stacking multiple $s_i$ within a single state. An Unmanned Air Vehicle (UAV, or drone) target is characterized by stacking multiple $s_i$ representing relatively wide harmonically related bands based on the fundamental blade passing frequency (BPF) of the drone. For implementation reasons in the state vector, complex values such as $s_i$ are treated as two unknowns (real and imaginary) per frequency.

In Kalman filtering, a state-space model includes a measurement equation relating the observed data to the state vector x, along with a state transition equation which describes how the states evolve over time. For the frequency domain particle velocity parameters in the state vector, (including vectors $s_i$, $B_i$ and scalar r) we assume a smoothly changing process over a small time step and therefore choose the state transition matrix to be the identity matrix. The constant velocity model is chosen to track the azimuth and elevation angles and their respective rates of change, as derived from the unit vector and its rate of change ($u_x$ $\dot{u}_x$ $u_y$ $\dot{u}_y$ $u_z$ $\dot{u}_z$).

The measurement equation to map $s_i$, $\varphi$, and $\theta$ to the measured cartesian particle velocities $s_x$, $s_y$, and $s_z$ is shown in Eqn. 7. As this expression is nonlinear, we use the so-called Extended Kalman Filer (EKF), which allows for linearization of the measurement model on every time step through the Jacobian matrix. The Jacobian represents a matrix of partial derivatives of the measurement model with respect to the state, and can be analytically computed during the design process to allow the model linearization step to execute efficiently at runtime.

The measurement model ties the particle velocity related parameters in the state vector to the measured pressure. Eqn. 3 can be recast to map $s_i$ and r to $p_i$, where i is the frequency index, by taking account of the previously measured complex correction value $H'_i$ determined for the AIVS in a calibration fixture using Eqn. 4:

$$p_i = B_i \frac{A_s}{A_0} \rho_0 c_0 \frac{s_i}{H'_i}\left(1 + \frac{1}{jk_i r}\right)^{-1} \quad \text{(Eqn. 8)}$$

Unknown factor $B_i$ allows for amplitude deviations between the modeled radial velocity $s_i$ and the scaled pressure due to reverberation, ground reflections, and interference. These second order physical effects could be explicitly included in the Eqn. 8 model in analytic, frequency dependent terms, but for many open sky tracking applications they are not dominant and are lumped together as one complex scale factor per frequency, or frequency band. Typically, $B_i$ has magnitude close to one.

Since $s_i$ represents the modeled radial velocity vector (updated in the state vector), and $p_i$ refers to the pressure measurement, both at the sensor, Eqn. 8 is valid for both plane and spherical wave models in both the near and far field. While the known frequency dependent $H'_i$ calibration factor (Eqn. 4) scales the velocity to pressure (divided by the acoustic impedance) in a free field, the presence of unknown range r in the state vector allows the phase of the modeled velocity to deviate from the pressure as it should in the near field. The estimated range has little significance in tracking applications, as it is only accurate in the near field, though it is important to have in the model to capture near field effects.

State vector x (Eqns. 6 and 7), measurement model (Eqn. 8), and constant velocity dynamics model for the time evolution of the unit vector, together define the structure of the EKF tracking algorithm. An EKF time step acquires a new set of acceleration measurements from the sampling hardware, consisting of $s_{xi}$, $s_{yi}$, $s_{zi}$, as well as the measured pressure $p_i$ for each frequency i (measurement matrix of four complex values per frequency), and calculates a new state vector x. In the UAS tracking application, two or three frequency bands, representing (for instance), the $3^{rd}$, $4^{th}$, and $5^{th}$ harmonics of the blade passing frequency (BPF), are simultaneously tracked. Because the drone will often have multiple propellers (e.g., quad, hex, or octocopters), and each of these propellers is separately driven at slightly different rates for effective navigation, the frequency bands used for tracking the drone position will be wide, on the order of ±50 Hz, but still significantly non-overlapping so as to discriminate the target from background noise.

For a low SWaP (size, weight, and power) based drone tracking system in which two frequency bands are tracked, the state vector is composed of two complex radial velocity vectors $s_i$ corresponding to each frequency, two $B_i$ terms, and a single value r related to near-field conditions, and six frequency independent unit vector parameters $u_x$ $\dot{u}_x$ $u_y$ $\dot{u}_y$ $u_z$ $\dot{u}_z$). The measurement matrix is composed of 16 real values (real and imaginary components of $s_{xi}$, $s_{yi}$, $s_{zi}$, and $p_i$ for 2 bands). By implementing the processing system as a set of parallel complex filter banks, each demodulated by the band center frequency via a DFT), the system can run with a small incremental time step to satisfy the Nyquist criterion. For the example above, in which a bank of complex filters having bandwidth ±50 Hz are used to generate the frequency domain velocity and pressure measurements, a 10 ms step size (100 Hz, or 50 Hz Nyquist) is sufficient. Alternatively, the complex measurement values can be computed using a 1/1 or ⅓ octave filter bank, or a short-time FFT with significant overlap to achieve the desired time step.

On each time step iteration, a matrix representing the modeled velocity and pressure is subtracted from the corresponding AIVS-measured values, and the current state estimate is optimally adapted via the state transition matrix to minimize the error between model and measurement. The model is nonlinear in $\varphi$ and $\theta$, and so a linearization step using the Jacobian matrix is performed on each iteration. The result is that the EKF produces state estimates with minimum mean-squared error (MMSE), as well as a confidence bound associated with each state parameter. These bounds are useful both in evaluating tracking quality, as well as for discrimination of valid detections from false alarms. Both the state estimates and confidence information can be passed downstream to machine detection and classification algorithms, as well as distributed localization methods that rely on multiple AIVS nodes in geographically diverse positions to collaboratively track suspected targets.

The azimuth and elevation angles for the case of one point source P at range r from one AIVS placed at the origin is shown in FIG. 9. In the measurement model for a single AIVS, estimates of $\varphi$ and $\theta$ are available on every time step of the EKF. The measurement model (Eqns. 7 and 8) may lack the ability to detect range for targets in the far field since the term in parentheses in Eqn. 8 rapid converges to one away from the sensor, especially when the frequency is not extremely low.

As such, a multi-AIVS model can be beneficially deployed to estimate and track the full 3d geographic position of one or more targets, utilizing individual [$u_{xi}$ $\dot{u}_x$ $u_y$ $\dot{u}_y$ $u_z$ $\dot{u}_z$]$_k$ estimates from a set of k geographically diverse AIVS, each of which may simultaneously observe the same target (or multiple targets). For this networked scenario, the index k refers to the $k^{th}$ AIVS, each of which is emplaced at a known position relative to the other AIVS in the multi-node system. Thus, in some implementations, a networked system of AIVS for collaborative detection and tracking can overcome the range detection limitations of a single AIVS. FIG. 10 shows the situation in which a second AIVS emplaced at second position $S_2$ in the local reference frame. Another state-space Kalman Filter deployed on a processor residing within the networked AIVS system can solve the 3d positioning problem. We form a state vector representing the unknown target position (x, y, z), and the rate of change of this position ($\dot{x},\dot{y},\dot{z}$), for a total of 6 states. All three coordinate changes by the target are presumed to follow a constant velocity model, but it is a straightforward extension to add an additional three states representing source acceleration 2) to track acoustic sources with rapidly changing speeds. Because the AIVS nodes at positions $S_1$ and $S_2$ (and possibly other collaborating nodes) are in the same reference frame, all six unknowns are shared between all collaborating AIVS since their sited positions are presumed known via manual measurement at the time each AIVS node is commissioned, or by GNSS positioning.

The corresponding measurement vector is formed from multiple sets of $[u_y, u_z]_k$ unit vector components estimated by each individual AIVS within detection range of the target, as well as the rate of change of these values $[\dot{u}_x, \dot{u}_y, \dot{u}_z]_k$. For the two AIVS shown in FIG. 10, the measurement vector has length 12. The measurement model, which relates the state vector (representing the target position and rate of change of position) to the measurements, is enhanced by introducing the rate of change parameters. The trigonometric equations describe the position of each AIVS ($x_k$, $y_k$, $z_k$) to the unknown target (x, y, z), and are nonlinear. However, they are linearized on every time step using a precomputed analytic Jacobian of the measurement model (with respect to the state), and executing the standard EKF process at runtime.

The state estimation process can generate confidence bounds for the target position, as can be observed in FIG. 10 which maps the estimated position error into azimuth ($\eta_1^+$, $\eta_1^-,\eta_2^+,\eta_2^-$) and elevation ($\varepsilon^+,\varepsilon^-$) error cones. Similarly, both the state vector and the measurement matrix on each AIVS can be expanded to track more than one target simultaneously, particularly if each target is separated in space, resulting in multiple sets of bearing angles per AIVS. Further, a similar extension to positioning algorithm on the networked processor will allow multiple simultaneous tracking of more than one target by an expansion of the model.

Figure 11:
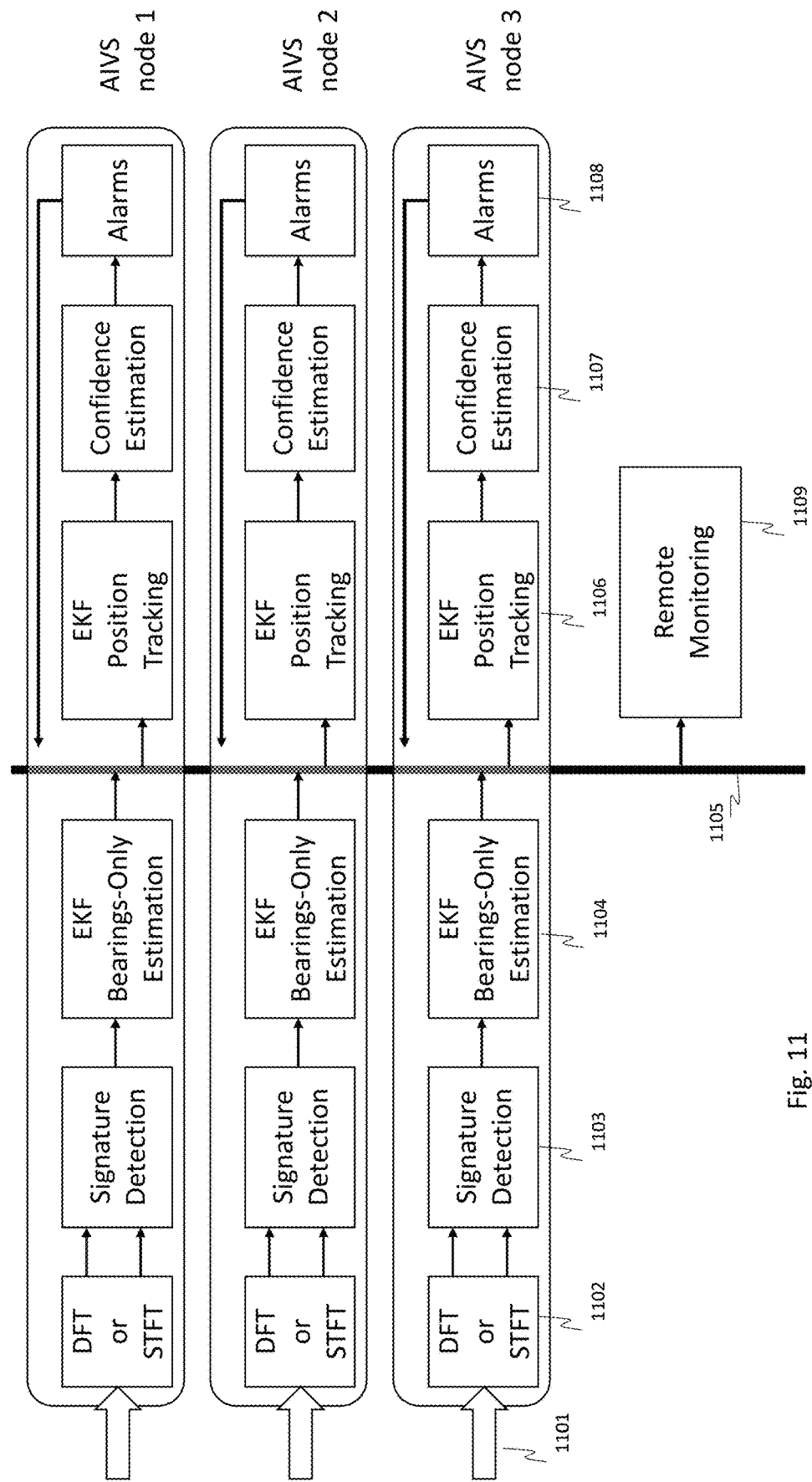
FIG. 11 is a flowchart of a method for collaborative processing in a multi-AIVS node system when three nodes are in the vicinity of the same acoustic source, and which are connected over a local wired or wireless network.

FIG. 11 represents the overall operation of a multi-AIVS node system operating on a local wired or wireless network or bus 1105. Each of the three nodes shown in FIG. 11 run identical software based on sampled data inputs 1101 from an AIVS connected to each processing node. DFT (Discreet Fourier Transform) or STFT (Short-Time Fourier Transform) block the frequency content into separate bands, appropriate for the specific type of acoustic source being tracked. For example, the first and second BPF harmonics of a quadcopter might occupy ±50 Hz bandwidths around 150 and 300 Hz. The output of the DFT (or STFT) of block 1102 are referred to as phasors which have been demodulated by the band center frequency. These signals are passed to signature detection block 1103 which employs an application specific algorithm to decide if an acoustic target of specific behavior is present. The DFT and signature detection blocks 1102 and 1103 run continuously on the fixed-point ARM M0+ of IoT processor 204, which can consume very low power. If the desired signature is detected, the higher power ARM M4 processor, and the associated FPU is moved from standby to run mode, and EKF bearings-only processing 1104 commences. The output of that block moves detected azimuth and elevation angles (or equivalently, the cartesian unit vectors), their rates of change, and statistical confidences for each parameter, to the wired or wireless network.

The collection of AIVS nodes in FIG. 11 represents a controller-less IoT network, in that each node individually samples, detects, and computes bearings-only results to acoustic sources as determined by the embedded application. These results are encrypted and broadcasted on the network, to be used by any other compatible node or client monitoring the network in a secure manner, such as block 1109.

Nodes that are actively computing bearings-only results can thus eavesdrop the network to see if other nodes are also active, i.e., computing bearings-only results which potentially could refer to the same acoustic source. If there are other active nodes broadcasting bearings-only data, this data can be consumed by the EKF position tracking block 1106, the operation of which was described in the preceding paragraphs as implementing trigonometric equations to relate the position of each AIVS ($x_k$, $y_k$, $z_k$) to the unknown target (x, y, z). Note that each active node includes its own position within the local or absolute coordinate system in the broadcasted bearings-only data. This position can be determined in multiple ways, from simple manual entry at the time of node emplacement (e.g., the nodes are emplaced at each of four corners of a roof), to automated GNSS-RTK moving baseline estimation methods. In the typical case, the accuracy of the node geometry is known to within one centimeter in three dimensions.

Nodes that are actively tracking position in block 1106 will have converged, high confident outputs when the bearings-only inputs from itself and at least one other node refer to a common acoustic source. Block 1107 discriminates the predicted confidences which result from EKF position estimation in block 1106 and issue an alarm 1108 if a confident solution is obtained. Computers, or remote clients, in block 1109 are monitoring wired or wireless network or bus 1105 for these alarms, as well as the associated position track data, and issue actions according to the needs of the specific application. A client in block 1109 can exist on the local network, or across a wide area network, employing routers and access points to the internet, and is application dependent.

Many modifications and variations of implementations of the present invention are possible in light of the above description. It is therefore to be understood that, within the scope of the appended claims, the invention many be practiced otherwise than as specifically described. The above detailed description is provided to illustrate specific implementations of the present invention and is not intended to be limiting. Numerous variations and modifications within the scope of the present invention are possible. The present invention is set forth in the following claims.

We claim:

1. An airborne acoustic vector sensor for simultaneously measuring triaxial particle acceleration in three dimensions and pressure, comprising:
   a triaxial MEMS accelerometer sensitive to an Earth gravitational field;
   one or multiple MEMS microphones sensitive to sound pressure and overlapping the accelerometer in frequency;
   a solid body having a density approximating a density of air, the accelerometer mounted in or upon the solid body; and
   a suspension system supporting the accelerometer and solid body within a framework.

2. The airborne acoustic vector sensor of claim 1, further comprising:
   a processor that applies calibrated amplitude adjustments to each of three axes of the measured acceleration, and that applies a frequency-dependent calibration to the measured pressure.

3. The airborne acoustic vector sensor of claim 2, wherein triaxial acceleration after calibration is integrated in time or frequency to compute triaxial particle velocity,
- wherein a frequency domain vector includes real and imaginary values of the measured pressure and the computed triaxial particle velocity for each of a plurality of frequency bands of interest,
- wherein a model relates the frequency domain vector to an unknown azimuth and elevation from the sensor to an acoustic source relative to an accelerometer reference axis, rates of change of azimuth and elevation, a frequency and acoustic impedance-normalized ratio between the measured pressure and the computed triaxial particle velocity, and a complex valued radial velocity estimate for each frequency band of interest,
- wherein a state-space filter provides updated estimates of the unknown azimuth and elevation on a time step, upon update of the frequency domain vector,
- and wherein the processor combines the updated estimates to compute a triaxial complex acoustic intensity in a reference frame of the accelerometer.

4. The airborne acoustic vector sensor of claim 3, wherein the processor further computes quantities from the measured acceleration and pressure as calibrated, including:
- a source detection statistic composed from measured spectral and time history values of the triaxial particle velocity, the triaxial complex acoustic intensity, and/or the pressure; and
- detected sound sources based on the source detection statistic, an estimated state vector, and related confidence information for each of a plurality of parameters in the state vector.

5. The airborne acoustic vector sensor of claim 3, wherein pitch and roll of the sensor is provided in an Earth reference frame,
- wherein the sensor measures heading of the accelerometer reference axis relative to a local or global reference frame,
- and wherein the processor computes bearing angles to detected sound sources in the local or global reference frame.

6. The airborne acoustic vector sensor of claim 5, wherein the airborne acoustic vector sensor is one of a networked group of airborne acoustic vector sensors,
- wherein a time offset and drift of each sensor is measured against a shared local or global time reference,
- wherein measured and derived quantities from each sensor are adjusted to align in time with other of the sensors in a local area network,
- wherein a current location of each sensor is measured or input in a shared three-dimensional reference frame,
- and wherein the measured and derived quantities as aligned and the current location of each sensor are transferred to the other of the sensors in the network, or to a processor on the network.

7. The airborne acoustic vector sensor of claim 6, wherein the local area network further includes a sensor or processor that derives a three-dimensional position and velocity of the detected sound sources within the shared three-dimensional reference frame.

8. The airborne acoustic vector sensor of claim 6, wherein the networked group of airborne acoustic sensors is used within a system for detecting and tracking an acoustic target, in which data packets representing bearing angles to one or multiple detected targets are received from each of the acoustic vector sensors that are placed at known positions,
- wherein a combined set of the bearing angles is modeled in correspondence to an estimated position of each detected target to each acoustic vector sensor, and a position and accuracy of the detected targets is based on residual errors between a set of expected bearing angles and the bearing angles represented by the data packets.

9. The airborne acoustic vector sensor of claim 8, wherein an acoustic vector sensor model is of a plane or spherical acoustic wave originating from one or multiple point sources in near or far field,
- wherein a detector includes a bank of complex bandpass filters having center frequencies at one or multiple harmonics of a target acoustic signature, related to a blade passing frequency (BPF); and that discriminates a propeller frequency by selecting frequency bands corresponding to a specified BPF signature, and
- wherein a state estimation process associates a detection confidence with a model fit error and signals an event upon positive detection.

10. The airborne acoustic vector sensor of claim 1, wherein the triaxial accelerometer is configured in a three-dimensional arrangement of three single-axis MEMS accelerometers.

11. The airborne acoustic vector sensor of claim 1, wherein the triaxial MEMS accelerometer is manufactured without plastic, glass, or ceramic packaging to minimize weight, and the solid body serves as a package for an accelerometer silicon die.

12. The airborne acoustic vector sensor of claim 11, wherein the solid body comprises a closed-cell lattice structure and fabricated using a stereolithography printing process.

* * * * *